(12) United States Patent
Tsai et al.

(10) Patent No.: US 7,884,456 B2
(45) Date of Patent: Feb. 8, 2011

(54) SEMICONDUCTOR DEVICE HAS ENCAPSULANT WITH CHAMFER SUCH THAT PORTION OF SUBSTRATE AND CHAMFER ARE EXPOSED FROM ENCAPSULANT AND REMAINING PORTION OF SURFACE OF SUBSTRATE IS COVERED BY ENCAPSULANT

(75) Inventors: Yun-Lung Tsai, Taichung (TW);
Yu-Chieh Tsai, Taichung (TW);
Chien-Chih Chen, Taichung (TW);
Chien-Ping Huang, Taichung (TW)

(73) Assignee: Silicon Precision Industries Co., Ltd., Taichung (TW)

( * ) Notice: Subject to any disclaimer, the term of this patent is extended or adjusted under 35 U.S.C. 154(b) by 83 days.

(21) Appl. No.: 12/233,170

(22) Filed: Sep. 18, 2008

(65) Prior Publication Data
US 2009/0008760 A1      Jan. 8, 2009

Related U.S. Application Data

(62) Division of application No. 11/163,309, filed on Oct. 13, 2005, now Pat. No. 7,443,016.

(30) Foreign Application Priority Data
Jun. 7, 2005     (TW) .............................. 94118702 A

(51) Int. Cl.
H01L 23/02       (2006.01)
(52) U.S. Cl. ...................................... 257/679; 257/687
(58) Field of Classification Search ................ 257/679, 257/687
See application file for complete search history.

(56) References Cited

U.S. PATENT DOCUMENTS

| 6,040,622 | A | 3/2000 | Wallace |
| 6,770,961 | B2 | 8/2004 | Lee |
| 2003/0034552 | A1 | 2/2003 | Wada et al. |
| 2003/0137042 | A1 | 7/2003 | Mess et al. |
| 2004/0169265 | A1 | 9/2004 | Bolken |
| 2004/0259291 | A1 | 12/2004 | Takiar |

Primary Examiner—Douglas M Menz

(57) ABSTRACT

A semiconductor device and a fabrication method thereof are provided. An opening having at least one slanted side is formed on a substrate. At least one chip and at least one passive component are mounted on the substrate. An encapsulant having a cutaway corner is formed on the substrate to encapsulate the chip and the passive component, wherein the cutaway corner of the encapsulant is spaced apart from the slanted side of the opening by a predetermined distance. A singulation process is performed to cut the encapsulant to form a package with a chamfer. The package is embedded in a lid to form the semiconductor device, wherein a portion of the substrate located between the slanted side of the opening and the cutaway corner of the encapsulant is exposed from the encapsulant to form an exposed portion. The present invention also provides a carrier for the semiconductor device.

8 Claims, 15 Drawing Sheets

US 7,884,456 B2

SEMICONDUCTOR DEVICE HAS ENCAPSULANT WITH CHAMFER SUCH THAT PORTION OF SUBSTRATE AND CHAMFER ARE EXPOSED FROM ENCAPSULANT AND REMAINING PORTION OF SURFACE OF SUBSTRATE IS COVERED BY ENCAPSULANT

CROSS-REFERENCE TO RELATED APPLICATION(S)

This application is a Divisional of co-pending U.S. application Ser. No. 11/163,309 filed Oct. 13, 2005, and the subject matter thereof is hereby incorporated herein by reference thereto.

FIELD OF THE INVENTION

The present invention relates to semiconductor devices and fabrication methods thereof, and more particularly, to a semiconductor device incorporated with a plurality of chips to serve as a memory card, and a method for fabricating the semiconductor device.

BACKGROUND OF THE INVENTION

Conventional multimedia memory card (MMC) has been disclosed by U.S. Pat. No. 6,040,622. As shown in FIG. 1A (PRIOR ART), the MMC 1 comprises a package 10 embedded in a lid 11 wherein conductive terminals (or gold fingers) 101 formed on a bottom surface 100a of a substrate 100 of the package 10 are exposed to the atmosphere, and the MMC 1 has a chamfer 13 for identifying a direction of application.

As shown in FIG. 1B (PRIOR ART), the package 10 embedded in the lid 11 comprises the substrate 100; a plurality of passive components 102 mounted at predetermined positions of the substrate 100; a flash memory chip 103; a controller chip 104; a plurality of gold wires 105, 106 for electrically connecting the flash memory chip 103 and the controller chip 104 respectively to the substrate 100; and an encapsulant 107 formed on the substrate 100, for encapsulating the passive components 102, the flash memory chip 103, the controller chip 104, and the gold wires 105, 106.

To prevent a resin compound making the encapsulant 107 from flashing to the conductive terminals 101 on the bottom surface 100a of the substrate 100 during a molding process for forming the encapsulant 107, a current strategy is to encapsulate only an inner portion 110 of a top surface 100b of the substrate 100 with the encapsulant 107, and allow an outer portion 120 surrounding the inner portion 110 of the top surface 100b of the substrate 100 to be exposed from the encapsulant 107. As such, the outer portion 120 is firmly clamped by a mold 12 during the molding process so as to prevent flash-over of the resin compound to the conductive terminals 101 of the substrate 100, as shown in FIG. 1C (PRIOR ART). For effectively preventing resin flash-over by clamping the substrate 100 during molding, the outer portion 120 of the substrate 100 should be sized at least 1 mm wide to be capable of being effectively clamped by the mold 12, which is thus considered occupying a significant part of the top surface 100b of the substrate 100 having a standard size, thereby reducing surface area for mounting chips and passive components on the substrate 100.

As shown in FIG. 1D (PRIOR ART), the substrate 100 used in the MMC 1 is presumed having an imaginary dotted line d indicating an edge of the fabricated encapsulant 107, such that an area on the top surface 100b of the substrate 100 encompassed by the dotted line d represents the inner portion 110, and an area of the top surface 100b outside the inner portion 110 represents the outer portion 120. An area of the top surface 100b shaded by oblique lines indicates a gate for injecting mold flow of the resin compound to fill the inner portion 110 to form the encapsulant 107 during the molding process. To prevent the mold flow from being affected by the chips 103, 104 and the passive components 102 and avoid uneven mold flow and voids formed in the encapsulant, a current solution is to reduce an area for mounting the chips and passive components on the substrate 100 by limiting the area to being located between two dotted lines e-e parallel to the direction of mold flow (as indicated by arrows), such that the mold flow can pass a region between the dotted line e and a side wall of a mold cavity to effectively avoid formation of voids. The dotted line e is located 3 mm inwardly from an edge of the inner portion 110 of the substrate 100. However, such method of reducing the area for mounting the chips and passive components limits the location and size of the chips and passive components that can be mounted on the substrate. As a result, under a condition that memory chips are enlarged in size with increase in capacity of memory cards, a flash memory chip having large capacity of e.g. 1 Gb is deemed oversized and cannot be accommodated on the foregoing substrate, making the conventional MMC fail to meet the requirement of memory capacity.

Accordingly, U.S. Patent Publication No. 2004/0259291A1 discloses a MMC that eliminates the foregoing problem and is capable of accommodating large chips therein, as shown in FIG. 2A (PRIOR ART). The MMC has such advantage because of using a large encapsulant 20 that covers a substrate 21 (as indicated by a dotted line) and a connective portion outside the substrate 21 to encapsulate chips and passive components (not shown). As such, a mold used in a molding process is allowed to clamp the connective portion rather than a top surface of the substrate 21, thereby making larger chips and passive components able to be mounted on the top surface of the substrate 21. The large encapsulant 20 also prevents formation of voids in the encapsulant 20.

However, conventional saw singulation equipment is not suitably applied to a singulation process of the above MMC with the substrate 21 being completely covered by the encapsulant 20 because the conventional saw singulation equipment can only perform linear cutting but fails to form a chamfer necessary for the MMC. Consequently, a water jetter or a laser cutting technique is required to cut and form the MMC with a desirable shape as shown by arrows in FIG. 2B (PRIOR ART). However, the use of water jetter or laser cutting technique increases fabrication costs and consumes much material in the cutting process, thereby not favorable for a cost-down strategy of the market.

SUMMARY OF THE INVENTION

In light of the foregoing drawbacks in the conventional technology, an objective of the present invention is to provide a semiconductor device for accommodating large chips and a fabrication method thereof, whereby surface area of a substrate can be completely used for mounting chips and passive components without being limited by a molding process.

Another objective of the present invention is to provide a semiconductor device for accommodating large chips and a fabrication method thereof, whereby conventional saw singulation equipment can be applied to a singulation process of the semiconductor device.

Still another objective of the present invention is to provide a semiconductor device for accommodating large chips and a fabrication method thereof, allowing the semiconductor device to be cost-effectively fabricated.

A further objective of the present invention is to provide a carrier comprising a substrate having surface area capable of completely used.

In order to achieve the above and other objectives, the present invention provides a semiconductor device for accommodating large chips. The semiconductor device comprises a package and a lid for covering the package. The package includes a substrate having a slanted side; at least one chip and at least one passive component, which are mounted on a surface of the substrate; a plurality of conductive elements for electrically connecting the chip to the substrate; and an encapsulant formed on the surface of the substrate for encapsulating the chip, the passive component and the conductive elements, wherein the encapsulant is formed with a cutaway corner corresponding to the slanted side of the substrate, such that only a portion of the surface of the substrate located between the slanted side thereof and the cutaway corner of the encapsulant is exposed from the encapsulant and the remaining portion of the surface of the substrate is completely covered by the encapsulant.

A method for fabricating the foregoing semiconductor device comprises the steps of: preparing a carrier formed with at least one opening having at least one slanted side, the carrier comprising at least one substrate having a slanted side corresponding to the slanted side of the opening, wherein each side of the substrate is located within periphery of the carrier; mounting at least one chip and at least one passive component at predetermined positions on the substrate of the carrier; electrically connecting the chip to the substrate via conductive elements; and forming an encapsulant on the carrier for encapsulating the chip, the passive component and the conductive elements, wherein the encapsulant is formed with a cutaway corner corresponding to the slanted side of the substrate, such that a portion of the substrate located between the slanted side thereof and the cutaway corner of the encapsulant is exposed from the encapsulant, and each side of the encapsulant except the cutaway corner thereof is located outside each side of the substrate except the slanted side thereof; performing linear cutting along each side of the substrate to form a package with only the portion of the substrate located between the slanted side thereof and the cutaway corner of the encapsulant being exposed from the encapsulant; and embedding the package in a lid.

The package of the semiconductor device in the present invention is shaped only by linear cutting without the use of water jetter or laser cutting technique to form a chamfer as in the conventional technology, such that conventional saw singulation equipment is suitably used in a singulation process in the present invention. Since an area of the carrier covered by the encapsulant is larger than surface area of the substrate, and only the portion of the substrate located between the slanted side thereof and the cutaway corner of the encapsulant is not covered by the encapsulant, a part of the carrier being clamped by a mold used in a molding process for forming the encapsulant, except the portion of the substrate to be exposed from the encapsulant, is located outside the substrate rather than occupying the surface area of the substrate for mounting chips and passive components. As such, large chips such as flash memory chips of 1 Gb can be placed on the substrate to provide high memory capacity for the semiconductor device. Further as the area of the carrier covered by the encapsulant is larger than the surface area of the substrate, this forms an interference-free space where mold flow of a resin compound for making the encapsulant is not interfered with the chip and the passive component during the molding process, thereby preventing uneven mold flow and formation of voids in the encapsulant. More particularly, the arrangement of chip and passive component on the substrate does not affect a path of the mold flow, such that the surface area of the substrate can be completely and well utilized.

In another preferred embodiment of the present invention, the area of the carrier covered by the encapsulant is identical to the surface area of the substrate, except the portion of the substrate located between the slanted side thereof and the cutaway corner of the encapsulant and exposed from the encapsulant. As such, the part of the carrier being clamped by the mold has an edge aligned with a side of the substrate and a side of the encapsulant. During the singulation process, the saw singulation equipment only needs to cut the carrier but not the encapsulant, such that wear of the saw singulation equipment and a used amount of the resin compound are reduced, thereby decreasing fabrication costs. However, the foregoing interference-free space, which can eliminate interference from the chip and the passive component to the mold flow, occupies the surface area of the substrate. Particularly, a portion of 3 mm wide inwardly from two opposite sides of the substrate respectively should be reserved not for mounting the chip and passive component so as to form the interference-free space. Although the surface area of the substrate for usage is reduced in this embodiment, this embodiment performing the singulation process via the conventional saw singulation equipment is still applicable to a case that memory chips or similar controller chips have a size not occupying a large area of the substrate.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor device and a fabrication method thereof proposed in the present invention are described as follows with reference to FIGS. 3 to 6. It should be noted that the expressions "slanted side of substrate", "cutaway corner of encapsulant" and/or "chamfer of semiconductor device" recited in the foregoing and following descriptions do not particularly refer to linear portions without any radian or turning point. A person skilled in the relevant art should understand that, the above "slanted side", "cutaway corner" and/or "chamfer" may be shaped with desirable radian and/or turning point according to different requirements on specification and functionality. For the sake of simplicity in description and allowing the description to be quickly and correctly realized, the expressions "slanted side of substrate", "cutaway corner of encapsulant" and/or "chamfer of semiconductor device" are still used hereinafter.

First Preferred Embodiment

Figure 1A:
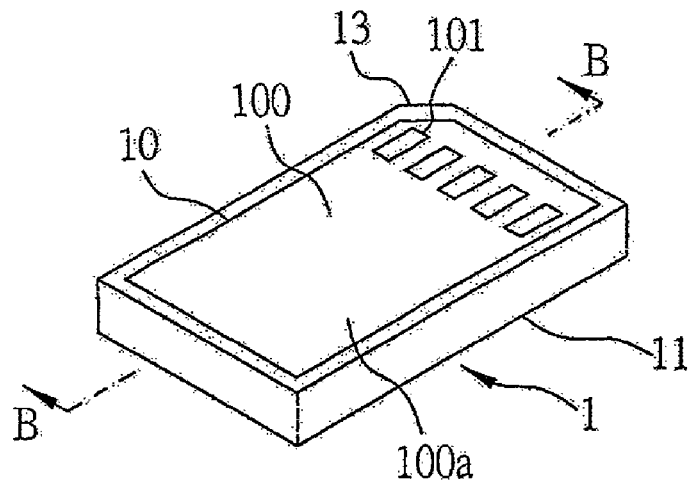
FIG. 1A (PRIOR ART) is a perspective view of a conventional multimedia memory card (MMC)
Figure 1B:
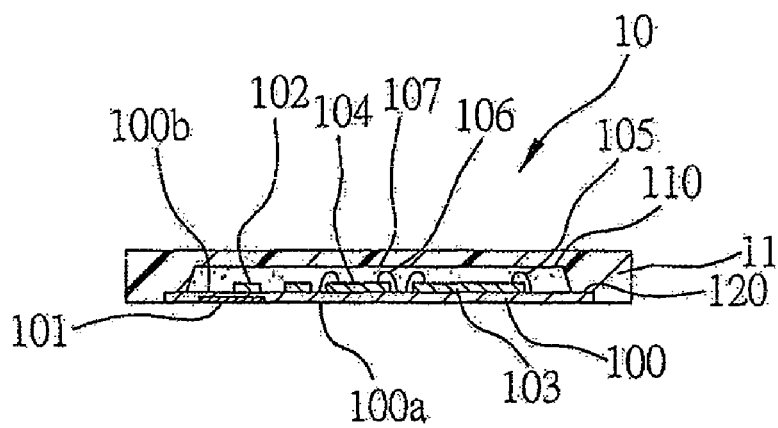
FIG. 1B (PRIOR ART) is a cross-sectional view of the MMC in FIG. 1A (PRIOR ART) taken along line B-B.
Figure 1C:
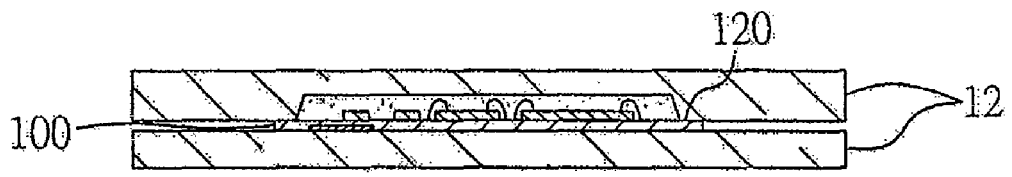
FIG. 1C (PRIOR ART) is a cross-sectional view showing a molding process for a package of the MMC in FIG. 1A (PRIOR ART)
Figure 1D:
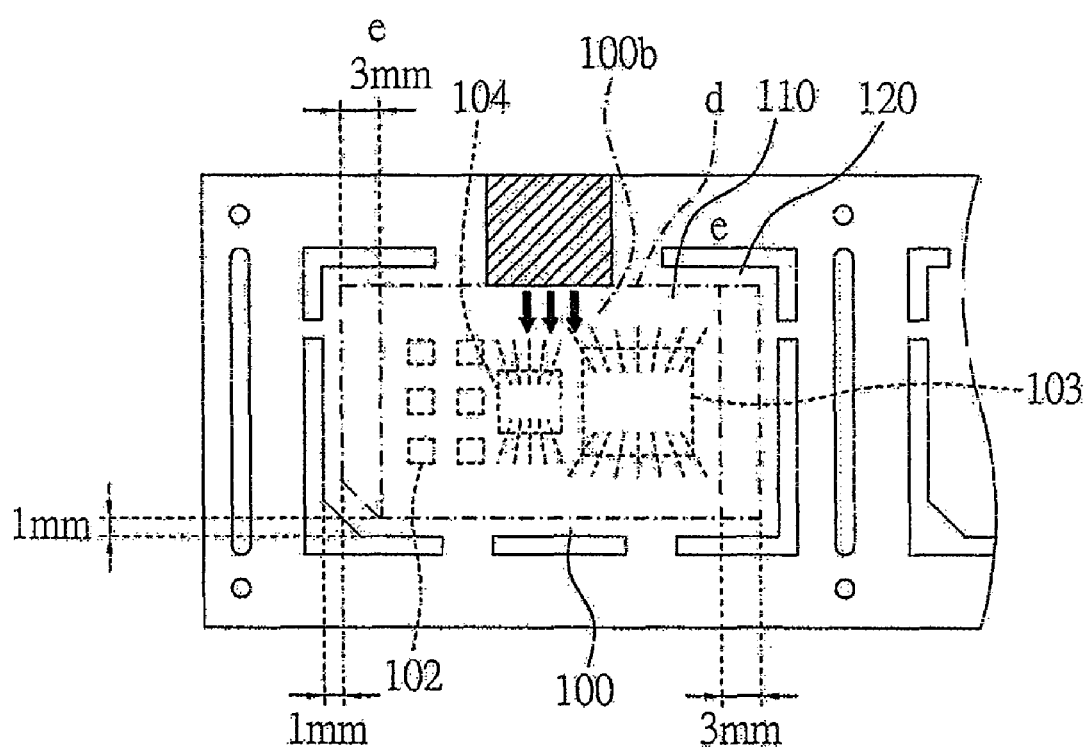
FIG. 1D (PRIOR ART) is a bottom view of a carrier used in the package of the MMC in FIG. 1A (PRIOR ART)
Figure 2A:
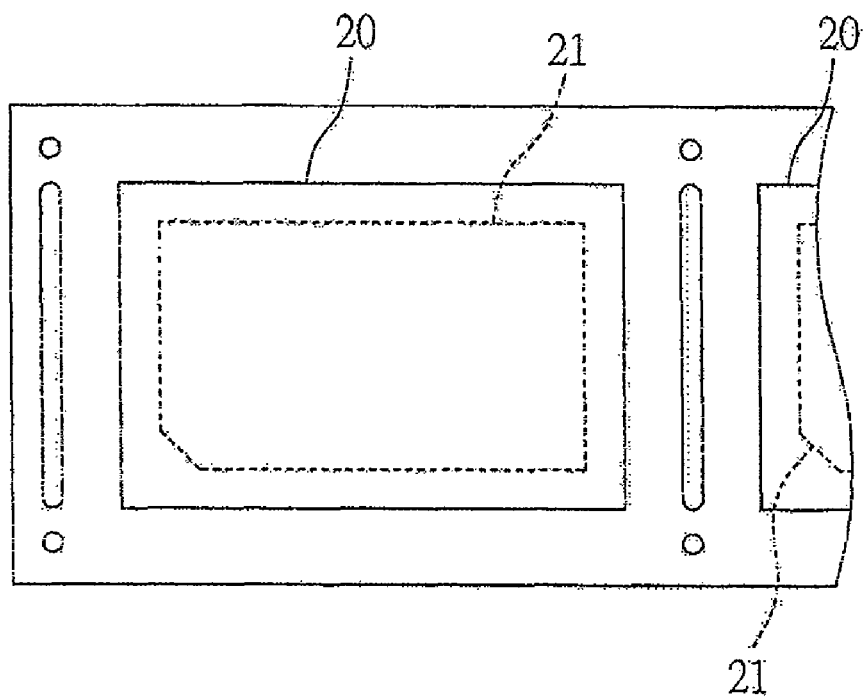
FIG. 2A (PRIOR ART) is a bottom view of another conventional MMC comprising a package having a carrier formed with an encapsulant thereon.
Figure 2B:
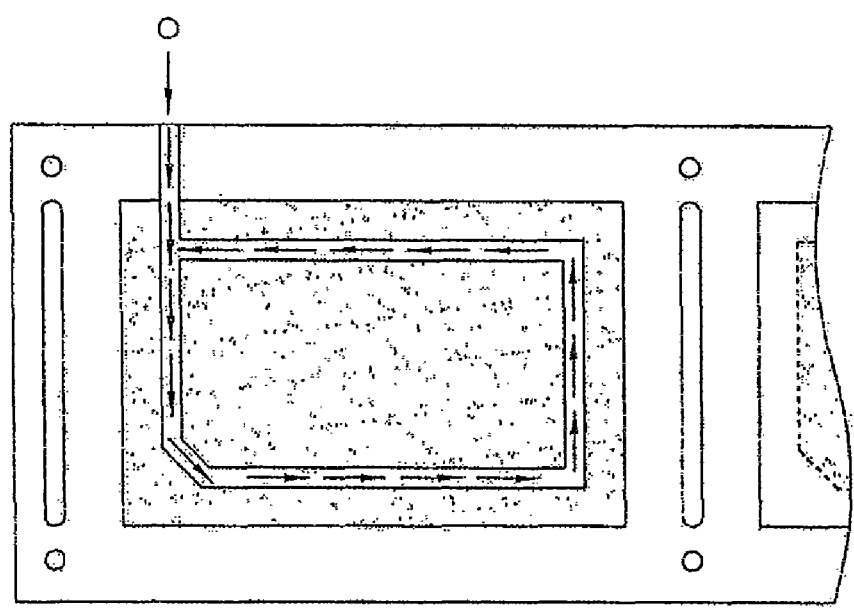
FIG. 2B (PRIOR ART) is a schematic view showing a singulation process for the package of the MMC in FIG. 2A (PRIOR ART)
Figure 3A:
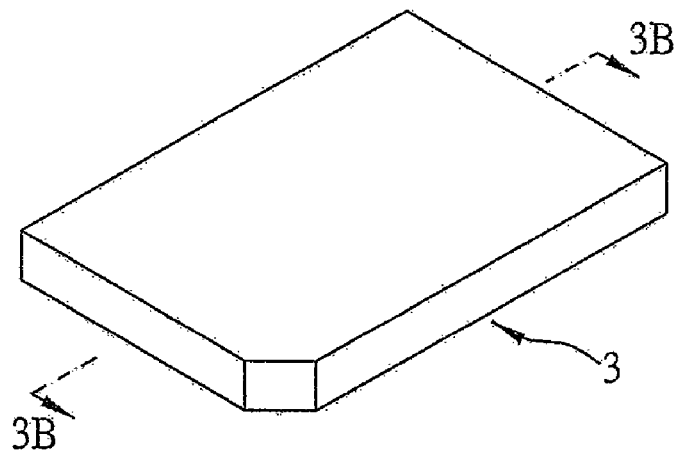
FIG. 3A is a perspective view of a semiconductor device in accordance with a first preferred embodiment of the present invention.
Figure 3B:
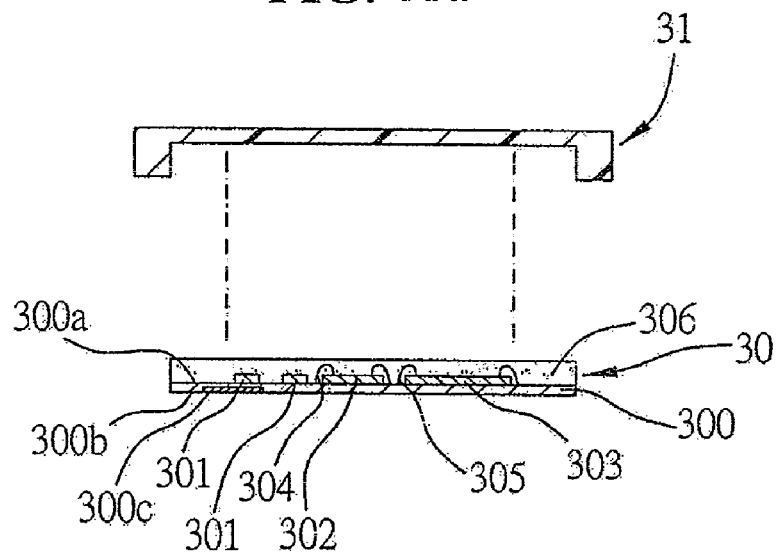
FIG. 3B is a cross-sectional view of the semiconductor device in FIG. 3A taken along line B-B.

As shown in FIGS. 3A and 3B, the semiconductor device 3 for accommodating large chips according to a first preferred embodiment of the present invention comprises a package 30 and a lid 31 for covering the package 30. As the combination of package 30 and lid 31 is well known in the art, it is not to be further detailed herein.

The package 30 comprises a substrate 300; a passive component 301, a controller chip 302 and a memory chip 303, which are mounted on an upper surface 300a of the substrate 300; gold wires 304, 305 for electrically connecting the controller chip 302 and the memory chip 303 to the substrate 300 respectively; and an encapsulant 306 formed on the substrate 300 for encapsulating the passive component 301, the controller chip 302, the memory chip 303, and the gold wires 304, 305.

Figure 3C:
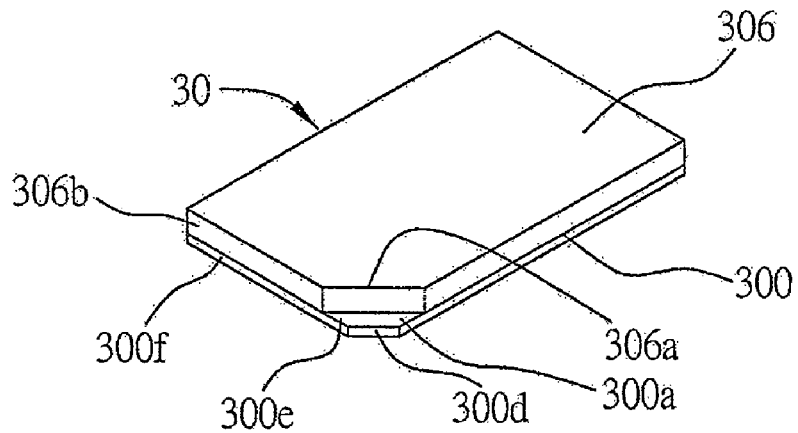
FIG. 3C is a perspective view of a package of the semiconductor device in FIG. 3B.

A lower surface 300b opposite to the upper surface 300a of the substrate 300 is formed with a plurality of electrical connection terminals 300c exposed from the substrate 300, which are used to electrically connect the passive component 301, the controller chip 302 and the memory chip 303 to an external device (not shown). As shown in FIG. 3C, the substrate 300 is further formed with a slanted side 300d corresponding to a cutaway corner 306a formed on the encapsulant 306, such that a portion on the upper surface 300a of the substrate 300 located between the slanted side thereof and the cutaway corner 306a of the encapsulant 306 is exposed from the encapsulant 306 to form an exposed portion 300e. The encapsulant 306 covers completely the upper surface 300a of the substrate 300 except the exposed portion 300e, and sides 306b of the encapsulant 306 except the cutaway corner 306a are coplanar with sides 300f of the substrate 300.

Figure 4A:
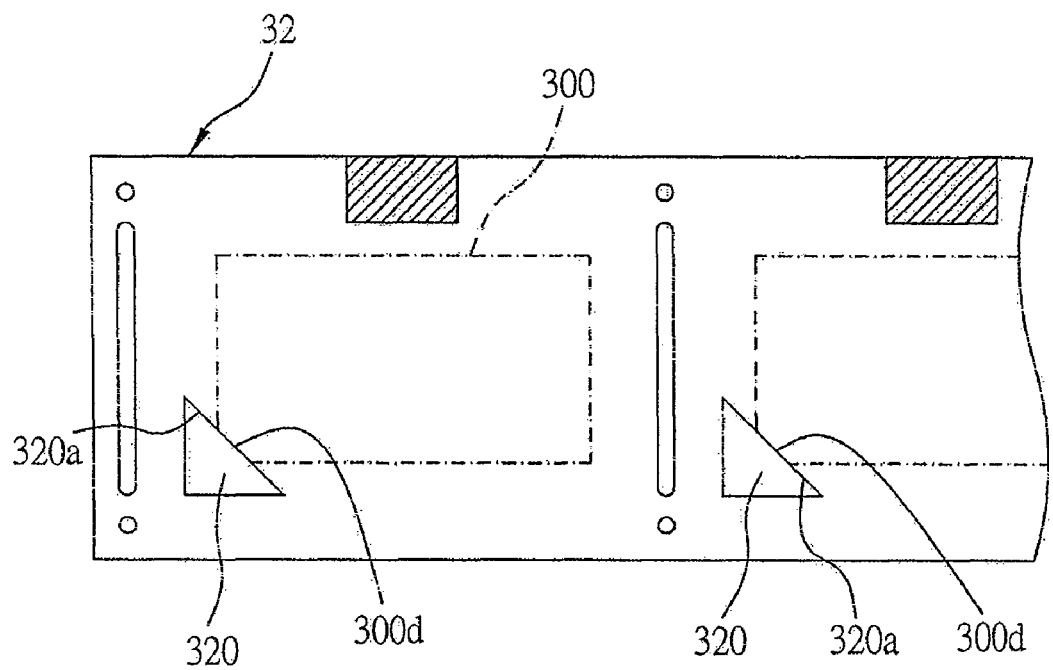
FIGS. 4A to 4Gb are schematic diagrams showing procedural steps of a fabrication method of the semiconductor device in accordance with the first preferred embodiment of the present invention.

FIGS. 4A to 4Gb illustrate steps of a fabrication method of the semiconductor device 3. Referring to FIG. 4A, firstly, a carrier 32 having a plurality of openings 320 is prepared, wherein each of the openings 320 is shaped as a right triangle by a conventional technique such as punching or routering and is formed with a slanted side 320a. An area on the carrier 32 is predetermined for forming a substrate 300 (a region indicated by dotted lines) connected to each of the openings 320, wherein the substrate 300 has a slanted side 300d (FIG. 3C) corresponding to the slanted side 320a of each of the openings 320. It should be noted that the shape of the opening 320 is not limited to a right triangle but can also be an obtuse triangle, acute triangle or equilateral triangle, or a semicircle or similar shape, as long as the slanted side 320a of the opening 320 corresponds to and is longer than the slanted side 300d of the substrate 300, or is equal in length to the slanted side 300d of the substrate 300 after a subsequent singulation process, so as to allow the slanted side 300d of the fabricated substrate 300 not to be necessarily cut in the singulation process, which is to be further described later with reference to the associated drawings. If the slanted side 300d of the substrate 300 is not linear, the opening 320 is not necessarily formed with linear sides. Since the slanted side 320a of the opening 320 corresponds to the slanted side 300d of the substrate 300, the slanted side 320a of the opening 320 should have a shape conforming to that of the slanted side 300d of the substrate 300. That is, if the slanted side 300d of the substrate 300 is shaped as a curve with radian or a line with a turning point, the corresponding slanted side 320a of the opening 320 should be identically shaped as well.

It should also be noted that the carrier 32 shown in FIG. 4A is a strip-shaped circuit board with the substrates 300 of the carrier 32 being arranged linearly and spaced apart from one another. This only provides an example of the carrier 32, and according to requirements on fabrication and specification, the carrier 32 may also be a rectangular circuit board with the substrates 300 thereof being arranged in an array, or a large circuit board having only one single substrate. It means that the number and manner of arrangement of the substrates 300 of the carrier 32 are not limited to those disclosed in the drawings of this embodiment but can be flexibly designed as a matter of choice for implementing the present invention without departing from the scope of the present invention.

Figure 4B:
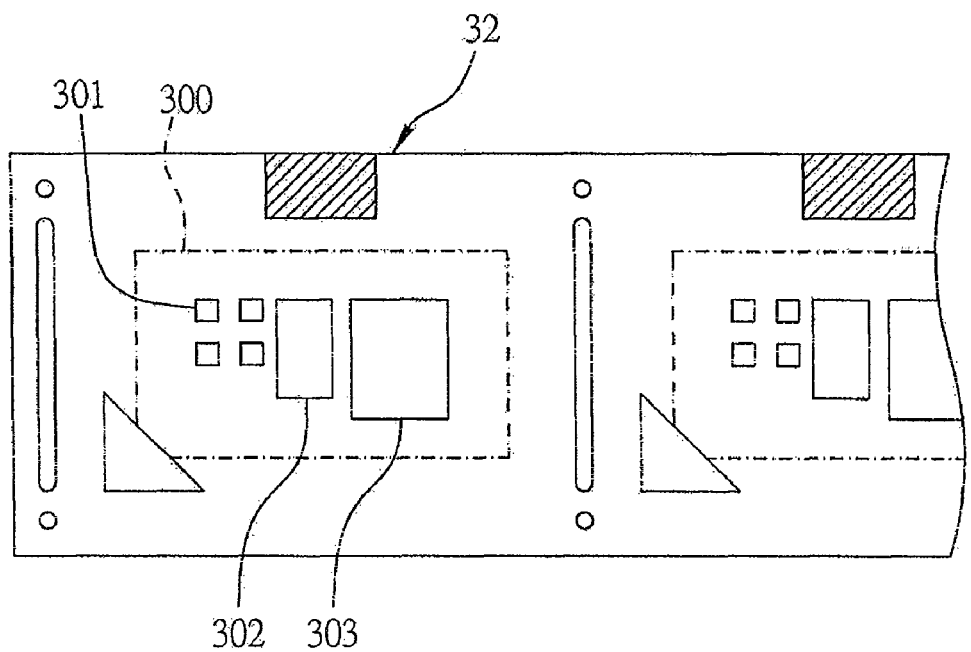

Referring to FIG. 4B, a die-bonding process is performed to mount four passive components 301, a controller chip 302 and a flash memory chip 303 on the predetermined area for forming the substrate 300 on the carrier 32. As the die-bonding process is well known in the art, it is not to be further described herein. It should be noted that the number of passive components and chips is not limited to that illustrated in this embodiment and the drawing but can be flexibly adjusted according to practical requirements. For example, an alternative is to mount only one large flash memory chip or two smaller memory chips.

Figure 4C:
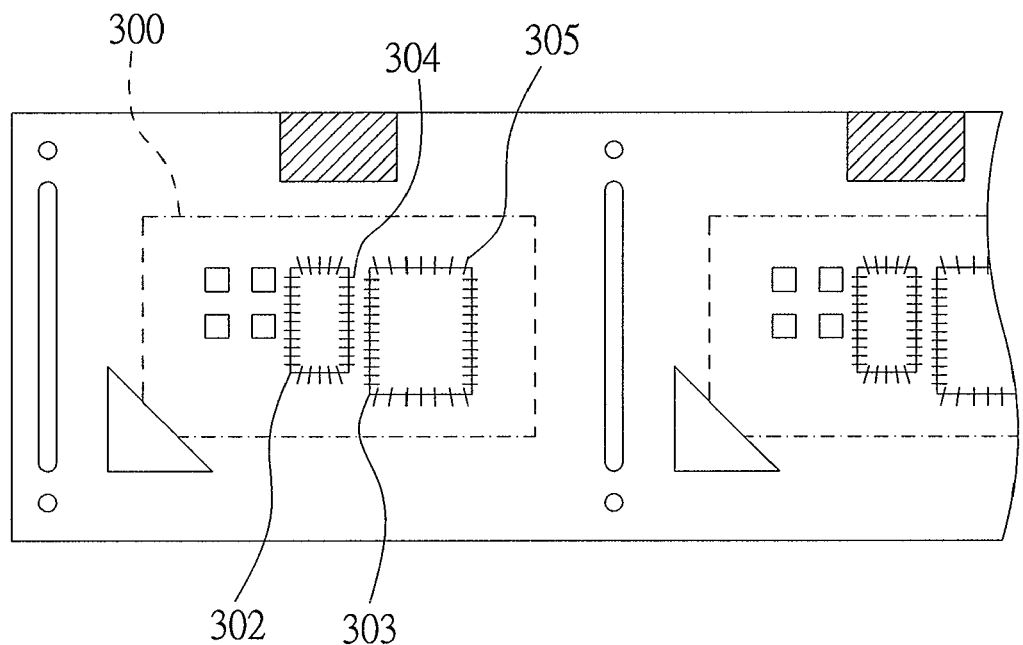

Referring to FIG. 4C, a wire-bonding process is performed to form gold wires 304, 305 for electrically connecting the controller chip 302 and the flash memory chip 303 respectively to the substrate 300. As the wire-bonding process is well known in the art, it is not to be further described herein. Alternatively, the foregoing chips may be electrically connected to the substrate by a flip-chip technique, which is a matter of choice for implementing the present invention without departing from the scope of the present invention and is not to be further detailed herein.

Figure 4D:
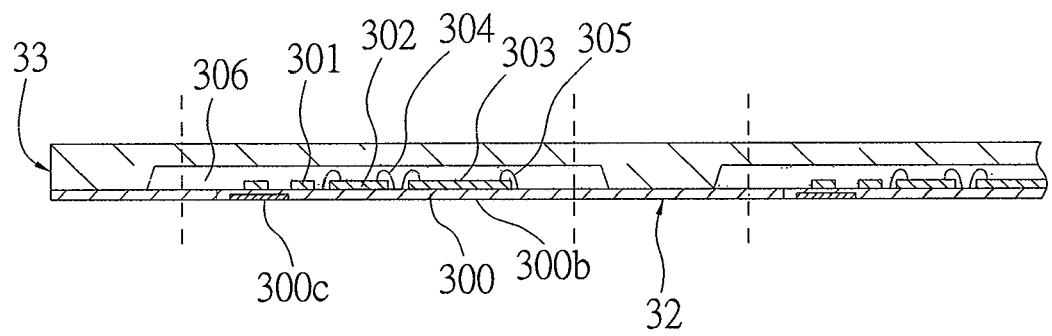

Subsequently, as shown in FIG. 4D, the carrier 32 mounted with the passive components 301, the controller chip 302 and the flash memory chip 303 thereon is placed into a mold 33 to perform a molding process, such that an encapsulant 306 is formed on the carrier 32 for encapsulating the passive components 301, the controller chip 302, the flash memory chip 303 and the gold wires 304, 305. As can be seen from the drawing, a part of the carrier 32 being clamped by the mold 33 is located outside the predetermined area for forming the substrate 300 (indicated by dotted lines). By this arrangement, not only a resin compound for making the encapsulant 306 is prevented from flashing-over to the electrical connection terminals 300c on the lower surface 300b of the substrate 300, but also the part of the carrier 32 being clamped by the mold 33 does not occupy surface area of the substrate 300, such that larger area on the substrate 300 is provided for mounting electronic components than that in the conventional technology, and thus large memory chips can be accommodated on the substrate 300.

Figure 4E:
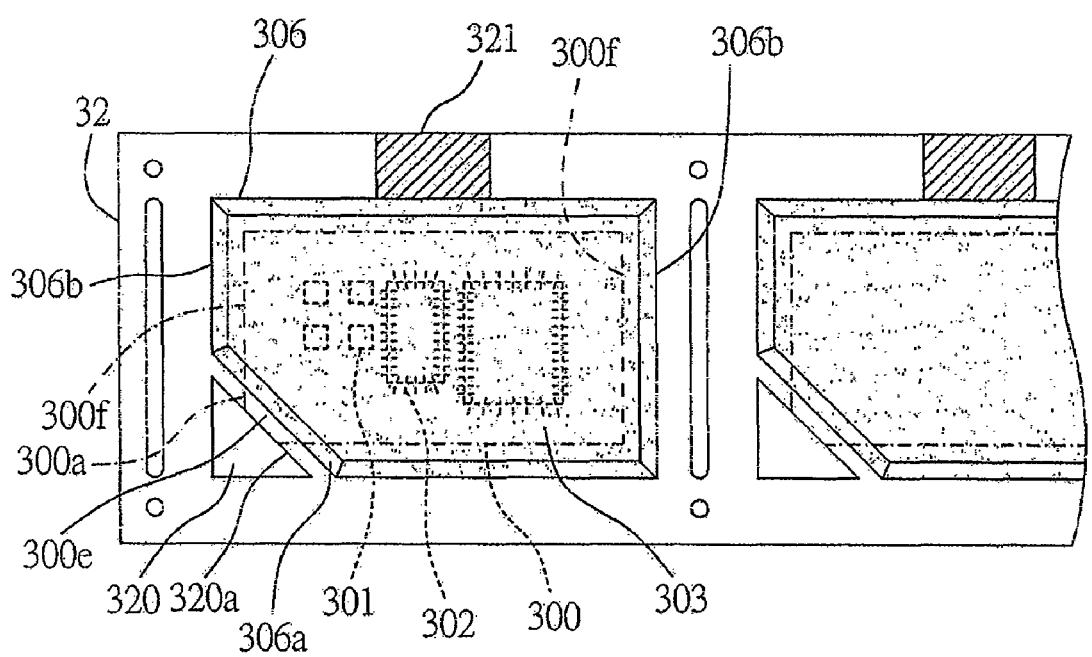

Referring to FIG. 4E, a demolding process is performed after the encapsulant 306 is fabricated, so as to remove the mold 33 from the carrier 32 formed with the encapsulant 306 thereon. As can be seen from the drawing, the encapsulant 306 has a size larger than the surface area of the substrate 300 (as indicated by dotted lines) and substantially completely covers the substrate 300. The encapsulant 306 is also formed with a cutaway corner 306a corresponding in position to the slanted side 320a of the opening 320, and the cutaway corner 306a of the encapsulant 306 is spaced apart from the slanted side 320a of the opening 320 by a predetermined distance, such that a portion of the upper surface 300a of the substrate 300 located between the cutaway corner 306a of the encapsulant 306 and the slanted side 320a of the opening 320 is exposed from the encapsulant 306 to form an exposed portion 300e. The exposed portion 300e is the only portion of the upper surface 300a of the substrate 300 that is uncovered by the encapsulant 306 and clamped by the mold 33 during the molding process, such that the cutaway corner 306a is formed on the encapsulant 306 after the encapsulant 306 is fabricated, and the exposed portion 300e is exposed from the encapsulant 306. As the area on the substrate 300 for mounting chips is usually located away from the exposed portion 300e, clamping the exposed portion 300e by the mold 33 during the molding process does not affect the arrangement of chips on the substrate 300.

Further as shown in FIG. 4E, two sides 306b of the encapsulant 306 are extended from two corresponding sides 300f of the substrate 300 to form a predetermined space between the two sides 306b of the encapsulant 306 and the two corresponding sides 300f of the substrate 300. The predetermined space allows mold flow (not shown) of the resin compound to flow smoothly via a mold gate 321 into a mold cavity on the carrier 32 for forming the encapsulant 306 without being interfered by the passive components 301, the controller chip 302 and the flash memory chip 303, thereby preventing uneven mold flow and formation of voids in the encapsulant 306. Since the predetermined space is located outside the substrate 300 and does not occupy the surface area of the substrate 300, it does not affect the area on the substrate 300 for mounting passive components and chips, such that large memory chips can be accommodated on the substrate to satisfy the requirement of high memory capacity.

Figure 4F:
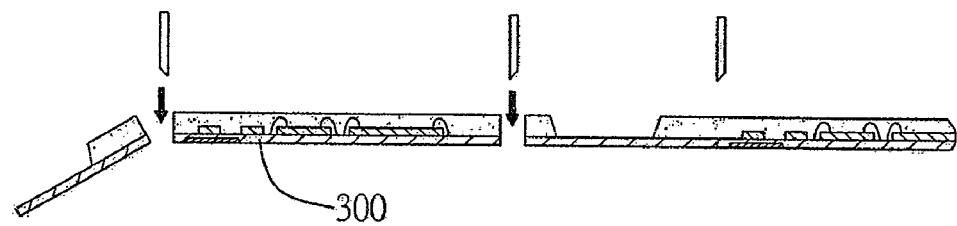
Figure 4F:
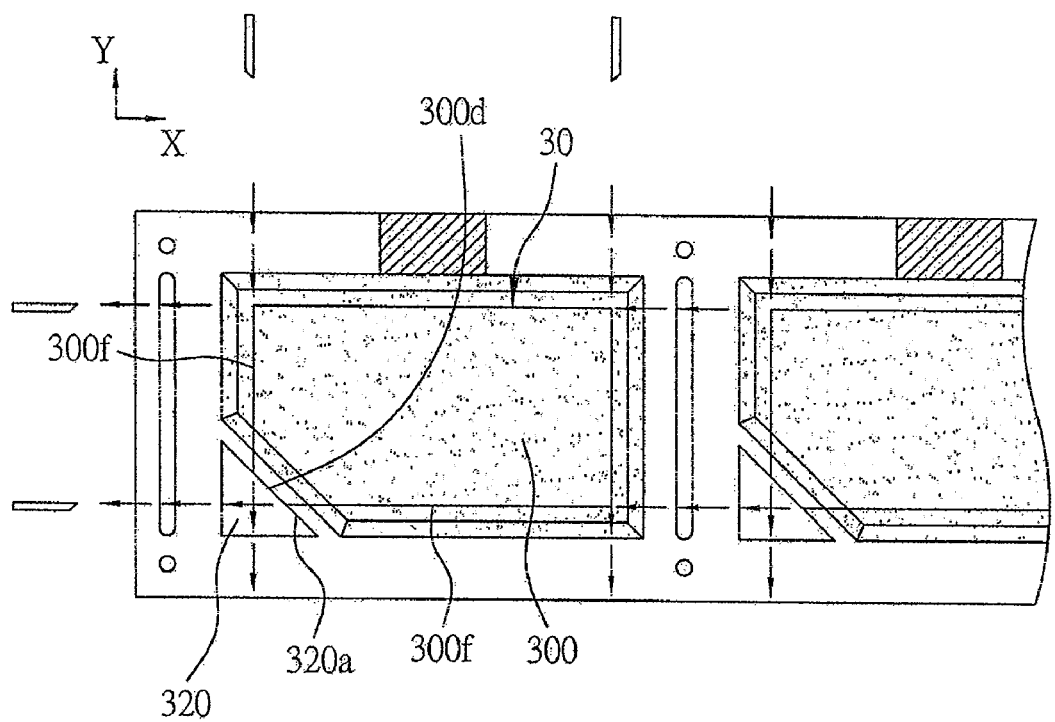

As shown in FIG. 4Fa, a singulation process is carried out to cut off a to-be-removed part located outside the substrate 300. As the singulation process only needs to perform linear cutting in directions of X and Y axes without oblique cutting, conventional saw singulation equipment can be used without having to use a water jetter or a laser cutting technique, thereby reducing the fabrication costs. As shown in FIG. 4Fb, two cutting lines respectively located on left and bottom sides of the drawing are intersected at a position in the opening 320, such that the slanted side 320a of the opening 320 has a portion located outside the side 300f of the substrate 300 to be separate from a portion located inside the side 300f of the substrate 300, thereby making the portion of the slanted side 320a of the opening 320 located inside the side 300f of the substrate 300 become the slanted side 300d of the substrate 300 after singulation. Particularly, the slanted side 300d of the substrate 300 is formed after the singulation process performing the linear cutting without oblique cutting. Thereby, a package 30 in the present invention is formed after singulation and provides a sufficient space on the substrate 300 for mounting chips and passive components, without having to employ a high-cost cutting tool such as the water jetter or laser cutting technique.

Figure 4G:
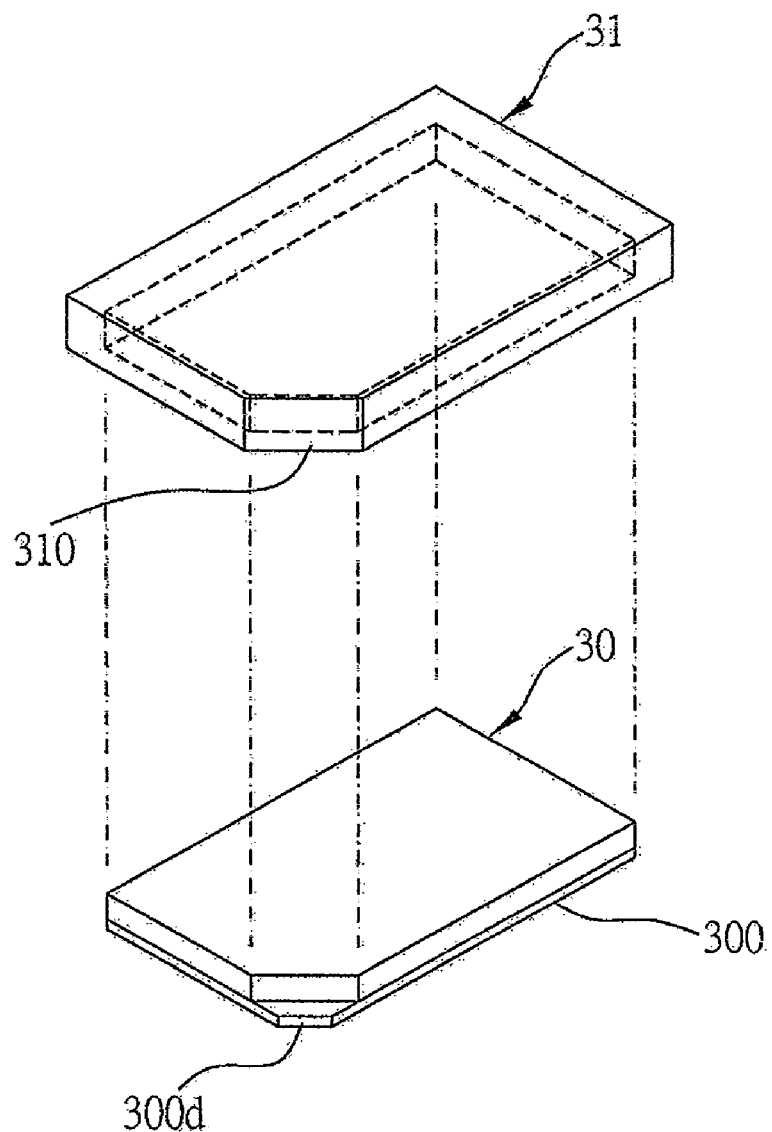
Figure 4G:
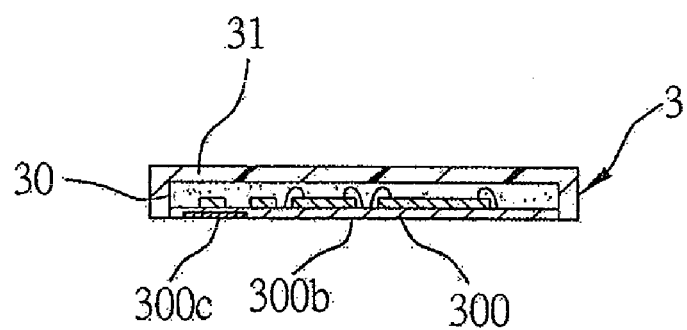

Finally, a lid 31 having a chamfer 310 is mounted to the package 30, as shown in FIG. 4Ga. The chamfer 310 is formed at a position corresponding to the slanted side 300d of the substrate 300 of the package 30, that is, when the package 30 is covered by the lid 31, the slanted side 300d of the substrate 300 is coupled to the chamfer 310. This thus forms the semiconductor device 3 in accordance with the first embodiment of the present invention as shown in FIG. 4Gb, wherein only the lower surface 300b of the substrate 300 of the package 30 is exposed from the lid 31, such that the electrical connection terminals 300c on the lower surface 300b of the substrate 300 are exposed and can be used to electrically connect the semiconductor device 3 to an external device such as a printed circuit board.

Second Preferred Embodiment

Figure 5A:
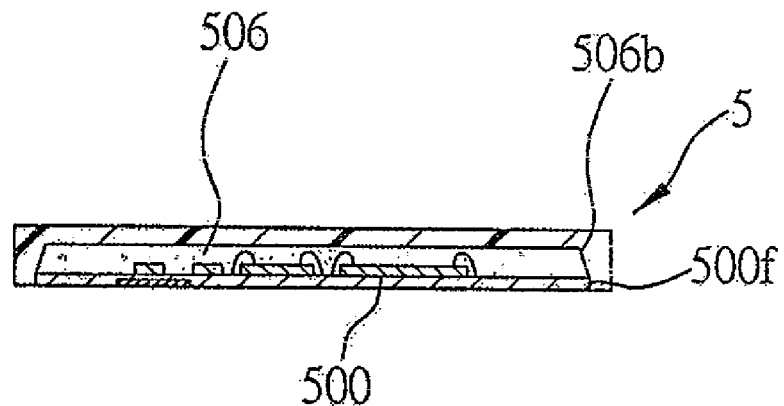
FIG. 5A is a cross-sectional view of a semiconductor device in accordance with a second preferred embodiment of the present invention.
Figure 5B:
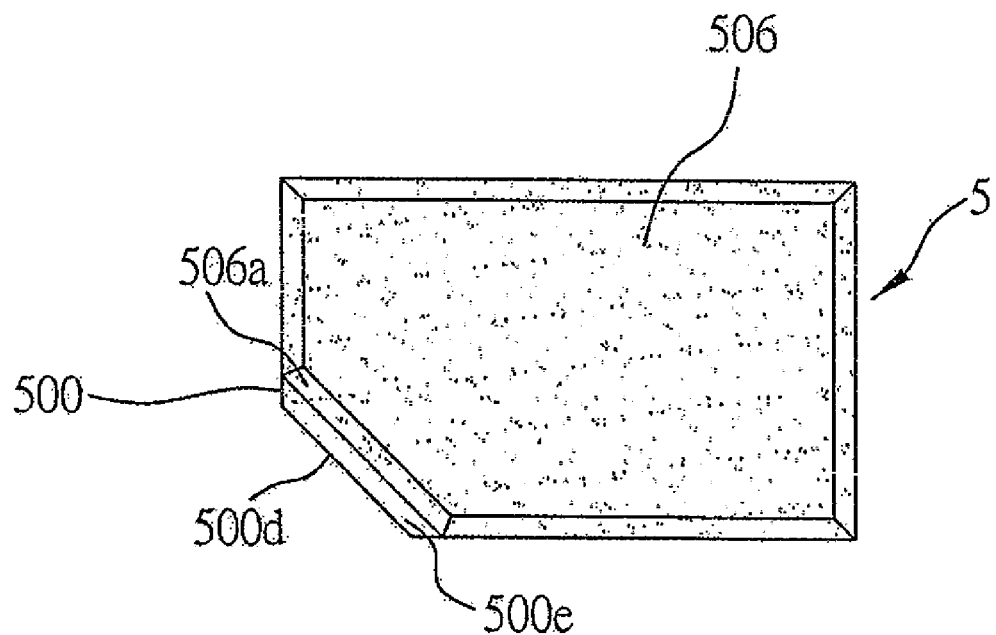
FIG. 5B is a bottom view of the semiconductor device in accordance with the second preferred embodiment of the present invention.

FIG. 5A is a cross-sectional view of a semiconductor device 5 in accordance with a second preferred embodiment of the present invention. The semiconductor device 5 is substantially the same in structure as the semiconductor device 3 of the first embodiment, with the difference in that, sides 506b of an encapsulant 506 of the semiconductor device 5 are not coplanar with sides 500f of a substrate 500 but are slanted inwardly, making the cross-section of the encapsulant 506 have a wedge shape. As shown in FIG. 5B, the encapsulant 506 covers substantially the entire surface area of the substrate 500 except an exposed portion 500e located between a slanted side 500d of the substrate 500 and a cutaway corner 506a of the encapsulant 506, that is, the area for forming the encapsulant 506 does not exceed the substrate 500. During a singulation process for fabricating a package 50 of the semiconductor device 5, saw singulation equipment (not shown) does not cut the encapsulant 506, thereby reducing time of the singulation process, wear of the saw singulation equipment and consumption of materials.

A method for fabricating the semiconductor device 5 is described with reference to FIGS. 6A to 6G.

Figure 6A:
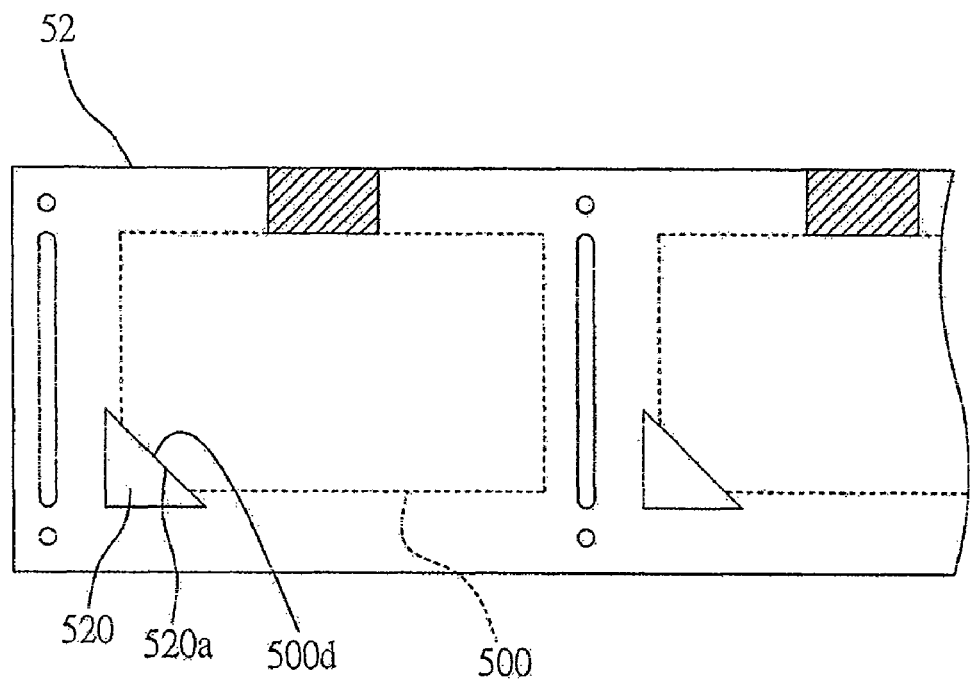
FIGS. 6A to 6G are schematic diagrams showing procedural steps of a fabrication method of the semiconductor device in accordance with the second preferred embodiment of the present invention.

As shown in FIG. 6A, firstly, a carrier 52 having a plurality of openings 520 spaced apart from each other is prepared. An area on the carrier 52 is predetermined for forming a substrate 500 (a region indicated by dotted lines) connected to each of the openings 520, wherein the substrate 500 has a slanted side 500d corresponding to a slanted side 520a of each of the openings 520. The other descriptions and details are the same as those described in the first embodiment, thereby not to be further repeated herein for the sake of brevity.

Figure 6B:
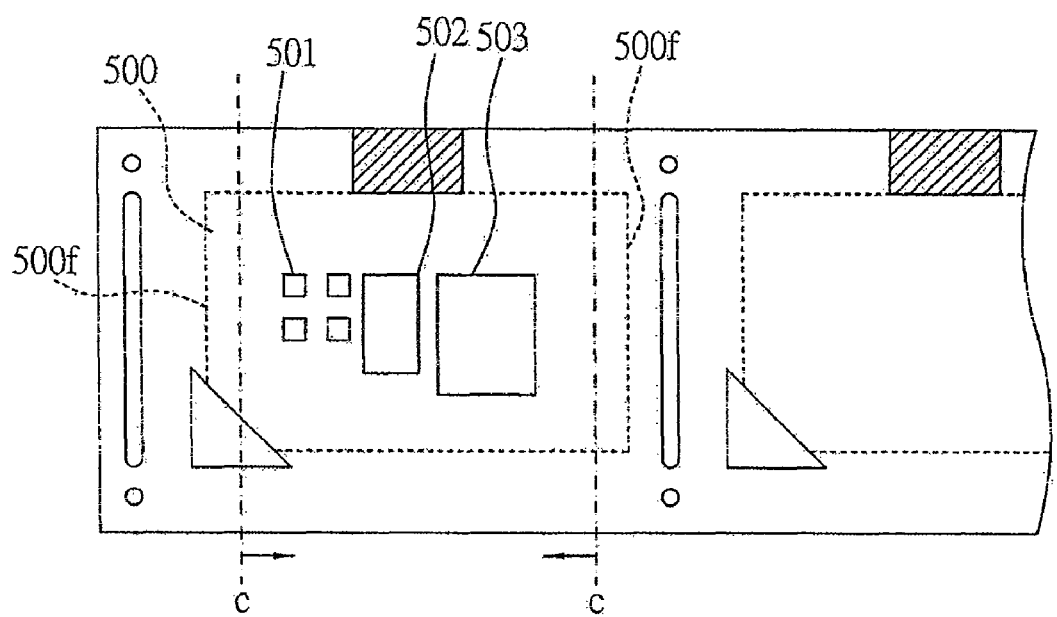

As shown in FIG. 6B, passive components 501, a controller chip 52, and a flash memory chip 503 are mounted on the area of the carrier 52 that is predetermined for forming the substrate 50 and is located within two opposite parallel imaginary lines C-C. An area on the substrate 500 for mounting passive components and chips is relatively smaller than that on the substrate 300 of the first embodiment, such that the size of chips suitable for mounting on the substrate 500 is restricted. The imaginary line C is located 3 mm inwardly from the side 500f of the substrate 500 to form a space between the imaginary line C and the side 500f of the substrate 500, and such space allows mold flow of a resin compound in a subsequent molding process to smoothly flow therethrough so as to prevent formation of voids.

Figure 6C:
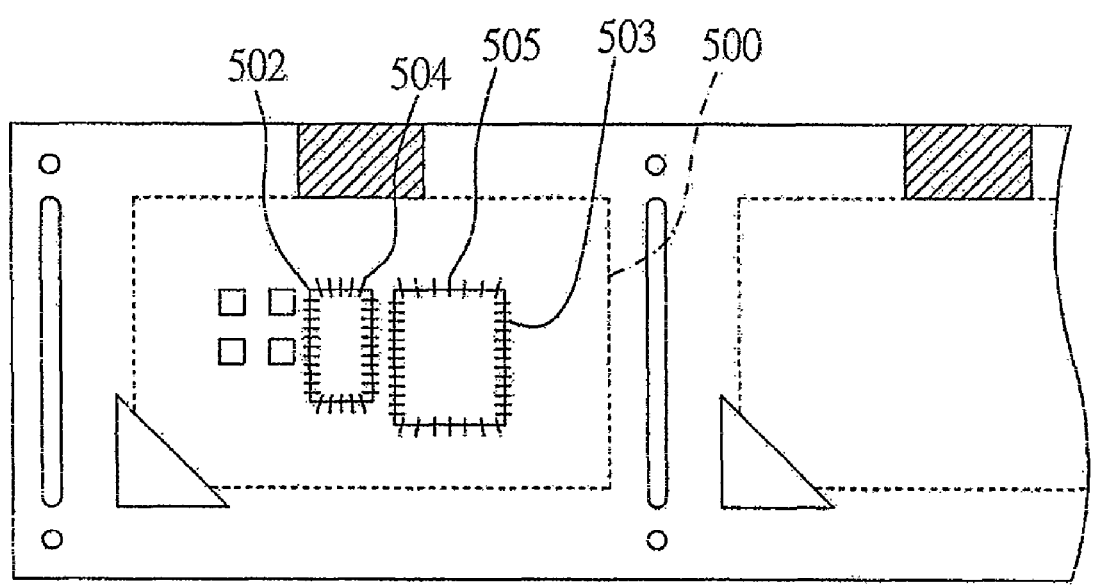

As shown in FIG. 6C, a wire-bonding process is performed to form a plurality of gold wires 504, 505 for electrically connecting the controller chip 502 and the flash memory chip 503 respectively to the substrate 500.

Figure 6D:
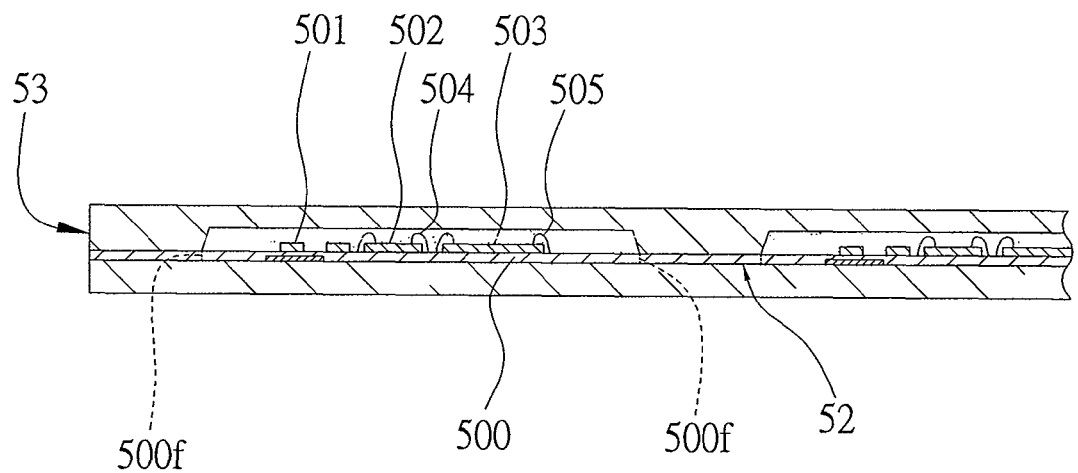

As shown in FIG. 6D, the molding process is performed to place the carrier 52 mounted with the passive components 501, the controller chip 502 and the flash memory chip 503 thereon into a mold 53 and to form an encapsulant 506 on the carrier 52 for encapsulating the passive components 501, the controller chip 502, flash memory chip 503, and the gold wires 504, 505. As can be seen from the drawing, a part of the carrier 52 being clamped by the mold 53 is located outside the substrate 500 and adjacent to the sides 500f of the substrate 500, and thereby does not occupy the area on the substrate 500 for mounting passive components and chips, making such area on the substrate 500 relatively larger than that of the foregoing U.S. Pat. No. 6,040,622.

Figure 6E:
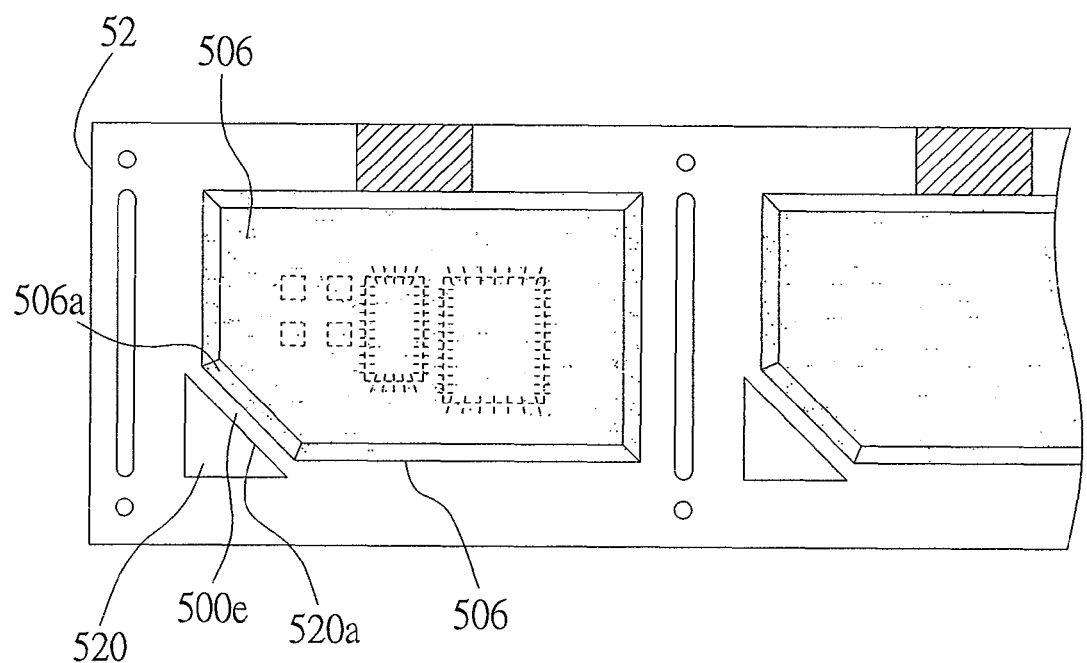

After the encapsulant 506 is fabricated, a demolding process is performed to remove the mold 53 from the carrier 52 formed with the encapsulant 506 thereon. After removal of the mold 53, as shown in FIG. 6E, the encapsulant 506 substantially covers the entire substrate 500 except that a portion of the substrate 500 located between the cutaway corner 506a of the encapsulant 506 and the slanted side 520a of the opening 520 is exposed from the encapsulant 506 to form an exposed portion 500e of the substrate 500. As similarly described in the first embodiment, the exposed portion 500e is the only portion of the substrate 500 being clamped by the mold 53.

Figure 6F:
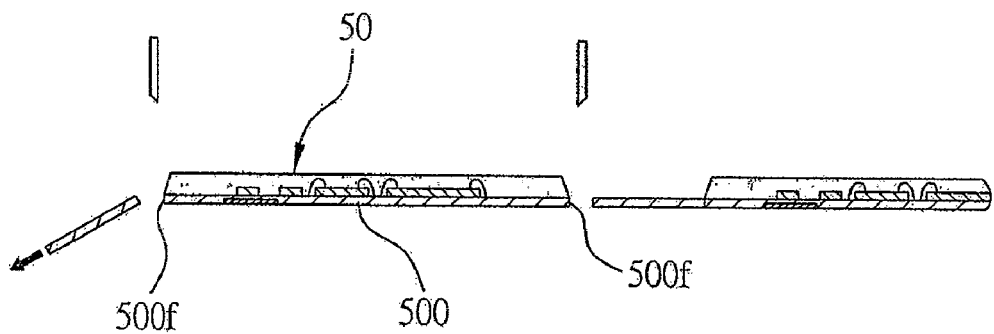
Figure 6F:
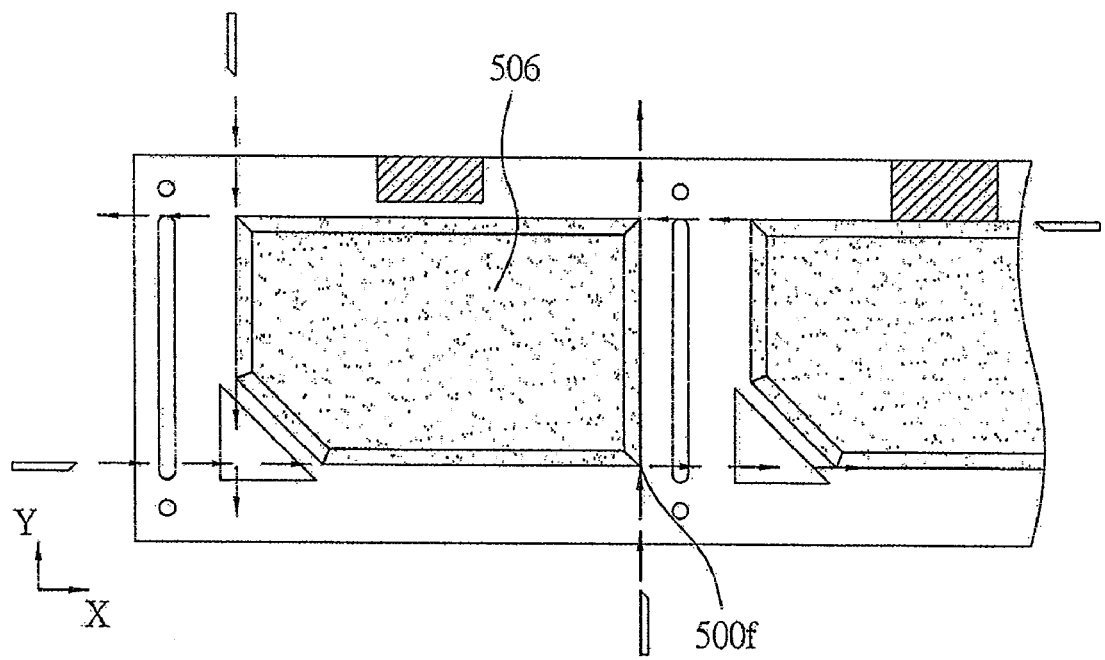
Figure 6G:
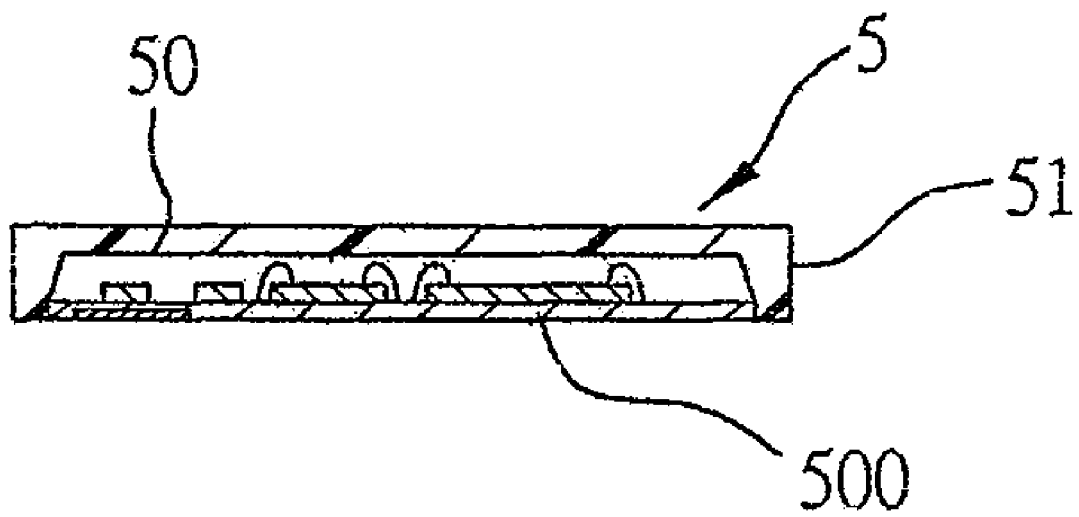

As shown in FIGS. 6Fa and 6Fb, a singulation process is carried out to separate a to-be-removed part located outside the substrate 500 from the substrate 500 to form a package 50. As can be seen from the drawing, the singulation process only performs linear cutting in directions of X and Y axes, such that conventional saw singulation equipment can be used. Further, cutting lines are aligned with the sides 500f of the substrate 500 without cutting the encapsulant 506, thereby reducing wear of the saw singulation equipment and time of the singulation process.

Finally, a lid 51 having a chamfer (not shown, similar to that shown in FIG. 4Ga) is mounted to the package 50 to form the semiconductor device 5 of the second embodiment.

Although the area on the substrate 500 of the semiconductor device 5 for mounting passive components and chips is smaller than that of the semiconductor device 3 of the first embodiment, such area on the substrate 500 of the semiconductor device 5 of this embodiment is still larger that that provided by the conventional technology to satisfy a suitable requirement on size of chips. Moreover, avoiding the use of a high-cost cutting tool such as a water jetter or a laser cutting technique in the present invention advantageously reduces consumption of materials and the fabrication costs.

The invention has been described using exemplary preferred embodiments. However, it is to be understood that the scope of the invention is not limited to the disclosed embodiments. On the contrary, it is intended to cover various modifications and similar arrangement. The scope of the claims therefore should be accorded the broadest interpretation so as to encompass all such modifications and similar arrangements.

What is claimed is:

1. A carrier for a semiconductor device, comprising a rectangular circuit board, the circuit board being formed with at least one opening and comprising at least one substrate having a slanted side, wherein the slanted side of the substrate corresponds to a slanted side of the opening, and the opening is located only outside the slanted side of the substrate.

2. The carrier of claim 1, wherein the slanted side of the opening is not shorter in length than the slanted side of the substrate.

3. The carrier of claim 1, wherein the opening has a shape selected from the group consisting of right triangle, obtuse triangle, acute triangle, equilateral triangle, semicircle, and similar shape.

4. The carrier of claim 1, wherein the slanted side of the substrate is a linear side.

5. The carrier of claim 1, wherein the slanted side of the substrate is a linear side having at least one turning point.

6. The carrier of claim 1, wherein the slanted side of the substrate is an arc side.

7. The carrier of claim 1, wherein the slanted side of the substrate is an arc side having at least one turning point.

8. The carrier of claim 1, wherein the at least one substrate comprises a plurality of the substrates spaced apart from one another.

* * * * *